United States Patent
Selverian et al.

(10) Patent No.: US 7,068,136 B2
(45) Date of Patent: Jun. 27, 2006

(54) LEAD-IN FOR ELECTRONIC BOBBINS

(75) Inventors: John H. Selverian, North Reading, MA (US); William D. Koenigsberg, Concord, MA (US); Joseph L. Parisella, Beverly, MA (US)

(73) Assignee: Osram Sylvania Inc., Danvers, MA (US)

( * ) Notice: Subject to any disclaimer, the term of this patent is extended or adjusted under 35 U.S.C. 154(b) by 0 days.

(21) Appl. No.: 10/807,797

(22) Filed: Mar. 24, 2004

(65) Prior Publication Data

US 2005/0212638 A1    Sep. 29, 2005

(51) Int. Cl.
*H01F 27/29* (2006.01)

(52) U.S. Cl. ...................... 336/192; 336/198
(58) Field of Classification Search .................. 336/65, 336/90, 107, 192, 198, 200
See application file for complete search history.

(56) References Cited

U.S. PATENT DOCUMENTS

| | | | | |
|---|---|---|---|---|
| 2,929,132 | A * | 3/1960 | Wohlhieter | 29/605 |
| 3,928,829 | A * | 12/1975 | Abrams | 335/151 |
| 4,617,543 | A | 10/1986 | Akachi et al. | 336/192 |
| 4,636,763 | A * | 1/1987 | Nabstedt et al. | 336/192 |
| 4,700,167 | A * | 10/1987 | Barankin et al. | 336/192 |
| 4,760,366 | A | 7/1988 | Mitsui | 336/233 |
| 4,853,667 | A * | 8/1989 | Freimuth et al. | 336/192 |
| 5,315,280 | A * | 5/1994 | Stokes et al. | 336/192 |
| 5,694,105 | A * | 12/1997 | Weiner | 336/198 |
| 6,369,682 | B1 * | 4/2002 | Thompson et al. | 336/192 |
| 6,559,749 | B1 * | 5/2003 | Weiner | 336/192 |
| 2002/0117330 | A1 * | 8/2002 | Eldridge et al. | 174/260 |

* cited by examiner

*Primary Examiner*—Tuyen T Nguyen
(74) *Attorney, Agent, or Firm*—Carlo S. Bessone

(57) ABSTRACT

A coil bobbin (10) has a housing (12) having a floor (14) with at least one electrical lead-in (16) projecting therethrough for attachment to a printed circuit board (18). The at least one electrical lead-in (16) is provided with thermal-strain relief (20) between said floor (14) and the printed circuit board (18). In a preferred embodiment of the invention the strain relief takes the form of a loop formed in the lead-in.

4 Claims, 2 Drawing Sheets

LEAD-IN FOR ELECTRONIC BOBBINS

TECHNICAL FIELD

This invention relates to electronic devices and more particularly to such devices that are potted with a material to help transfer heat out, to provide protection from moisture, and to attenuate the effects of mechanical shock, etc. One specific, non-limiting example of such a device is a ballast for use with arc discharge lamps.

BACKGROUND ART

Because of internal thermal dissipation, the temperature of an electronic ballast for arc discharge lamps increases when the ballast is turned on and decreases, that is, returns to ambient temperature, when it is turned off. Repetition of this operation in meeting daily lighting requirements is referred to as temperature cycling. Even when not being used the ballast is subject to the rise and fall of the ambient temperature. This can be critical to the reliability of operation in an outdoor environment, especially in colder climates, because of thermomechanically-induced forces impressed upon circuit board solder joints.

Solder joint cracking is often associated with electronic components that are not strain-relieved on ballast circuit boards that are encapsulated in, for example, asphalt-based potting compounds. This occurs because of thermomechanically-induced forces on the circuit board solder joints. This strain is the consequence of two things: temperature cycling of the ballast and the substantial inherent mismatch between the coefficients of expansion of the potting material and the electronic components.

Over the temperature range of expected operation, the thermal expansion coefficient of asphalt is nominally 8 to 10 times greater than that of the copper or solder. When the temperature increases, the encapsulating potting material expands, pushing components away from the circuit board; when the temperature decreases, the potting material shrinks, pulling components toward the board. Ultimately, this thermally induced pushing and pulling fatigues the solder joints, causing mechanical failure and subsequent electrical disconnection within the circuit.

One of the major components exhibiting these types of problems are bobbins about which wire windings are wrapped, such as transformers and inductors used in the afore-mentioned electronic ballasts. Existing bobbins have lead-ins that serve as rigid connections between the windings and the circuit board. Generally, these lead-ins are either straight or L-shaped.

It would be an advance in the art if simple modifications could be made to these structures to reduce or eliminate the thermally-induced strain problems caused by thermal cycling.

DISCLOSURE OF INVENTION

It is, therefore, an object of the invention to obviate the disadvantages of the prior art.

It is another object of the invention to enhance strain relief in electronic components.

It is yet another object of the invention to achieve these results without extensive modifications of existing bobbins.

These objects are accomplished, in one aspect of the invention, by a coil bobbin that comprises a housing having a floor with at least one electrical lead-in projecting therethrough for attachment to a printed circuit board, the at least one electrical lead-in being provided with thermal-strain relief between the floor and the printed circuit board.

BRIEF DESCRIPTION OF THE DRAWINGS

FIG. 4 is a graph of temperature-induced strain in a prior art lead-in; and

BEST MODE FOR CARRYING OUT THE INVENTION

For a better understanding of the present invention, together with other and further objects, advantages and capabilities thereof, reference is made to the following disclosure and appended claims in conjunction with the above-described drawings.

Figure 1:
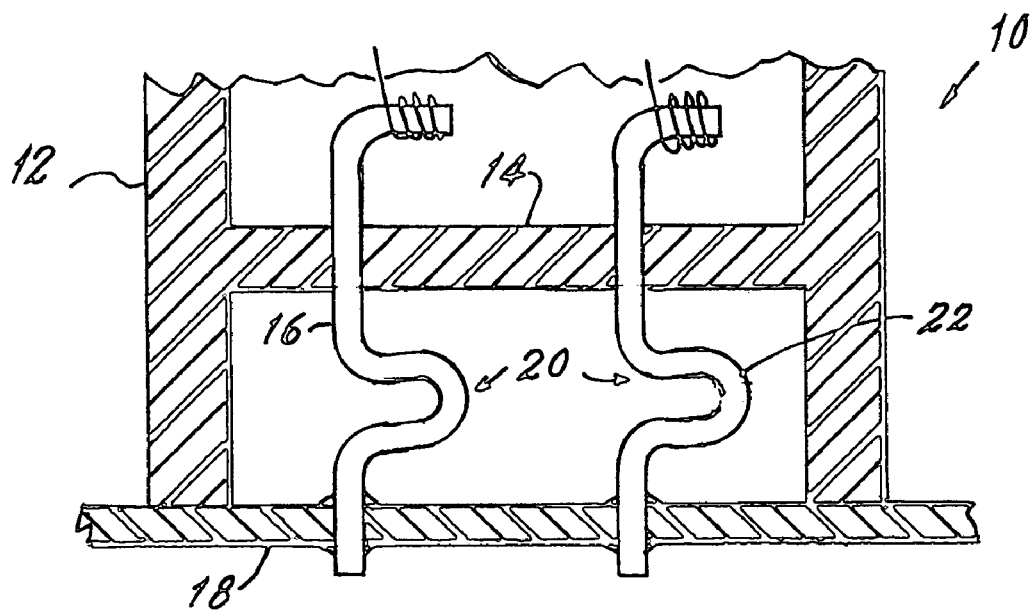
FIG. 1 is a sectional, elevational view of an embodiment of the invention.

Referring now to the drawings with greater particularity, there is shown in FIG. 1 a coil bobbin 10 comprising a housing 12 having a floor 14 with at least one electrical lead-in 16 projecting therethrough for attachment to a printed circuit board 18. The at least one electrical lead-in 16 is provided with thermal-strain relief 20 between the floor 14 and the printed circuit board 18.

Figure 2:
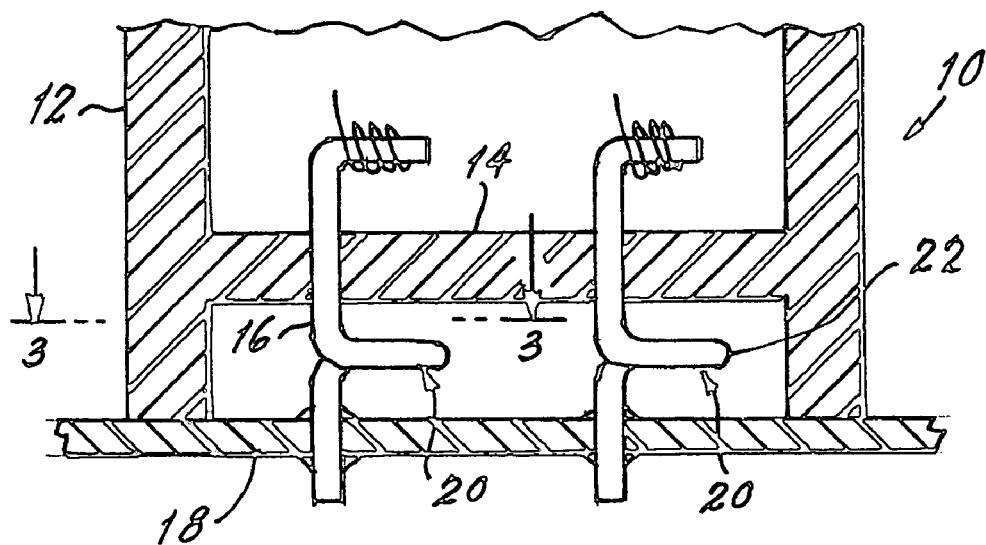
FIG. 2 is a similar view of an alternate embodiment.
Figure 3:
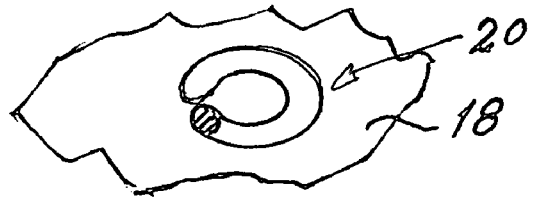
FIG. 3 is a sectional plan view taken along the line 3—3 of FIG. 2.

The thermal-strain relief 20 comprises a loop 22 formed in the electrical lead-in 16. The loop can be U-shaped as shown in FIG. 1 or O-shaped as shown in FIG. 3. Additionally, the loop can be formed parallel to the plane of the circuit board and floor as shown in FIGS. 2 and 3 or it can be normal to that plane, as shown in FIG. 1. The actual orientation of the loop 20 can be dependent upon the amount of space existing between the floor 14 and the printed circuit board 18.

Figure 4:
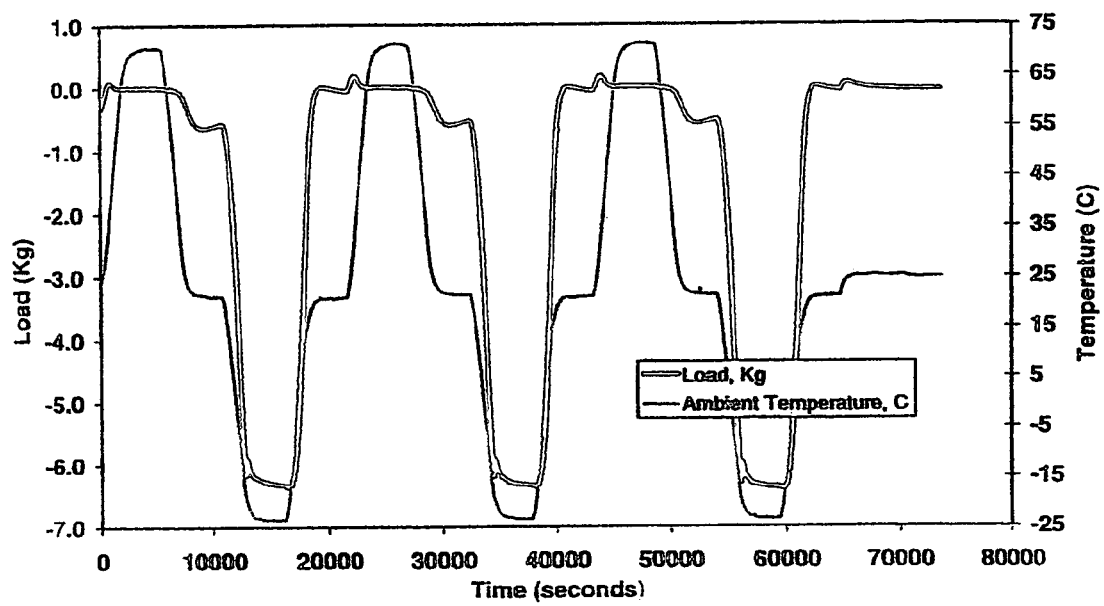
Figure 5:
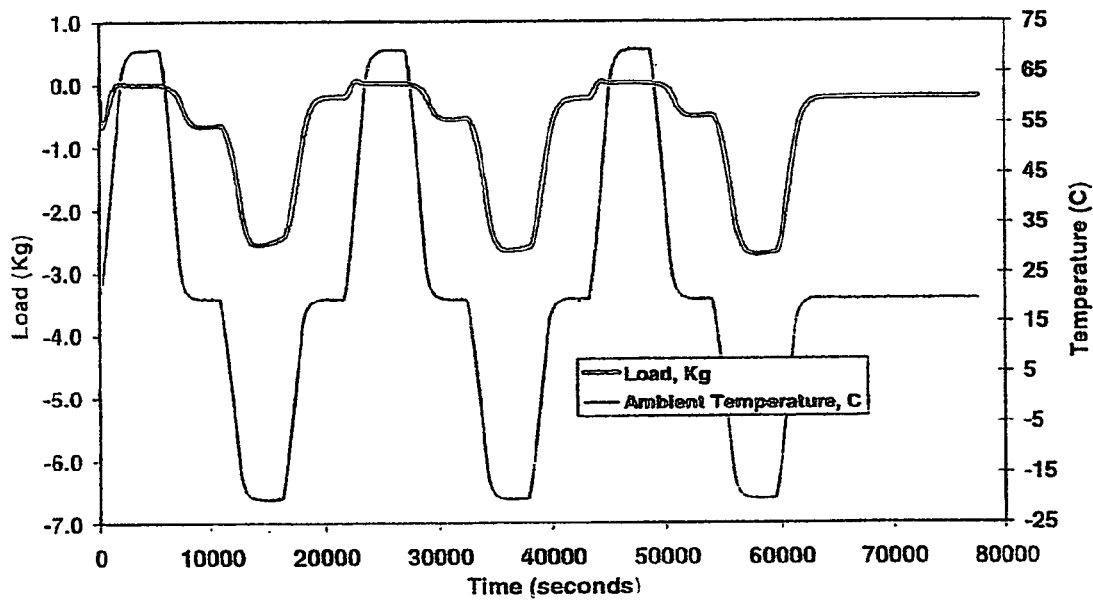
FIG. 5 is a similar graph of temperature-induced strain in a bobbin of the invention.

The difference in strain relief between the prior art straight and rigid lead-ins and the strain-relieved lead-ins provided by this invention is shown in FIGS. 4 and 5. As will be seen in FIG. 4 the peak load induced in the straight lead-ins is about 6 kg while with the strain-relieved lead-in the force drops to about 2.5 kg, a significant difference. This lower load due to the strain relief provided in the lead-in of the present invention results in a significantly longer life of the solder joints and hence of the electronic equipment.

While there have been shown and described what are at present considered to be the preferred embodiments of the invention, it will be apparent to those skilled in the art that various changes and modification can be made herein without departing from the scope of the invention as defined by the appended claims.

The invention claimed is:

1. A coil bobbin comprising:
a housing having a floor with at least one electrical lead-in projecting therethrough for attachment to a printed circuit board, said at least one electrical lead-in being provided with thermal-strain relief formed in said electrical lead-in between said floor and said printed circuit board.

2. The coil bobbin of claim 1 wherein said thermal-strain relief comprises at least one loop formed in said electrical lead-in.

3. The coil bobbin of claim 2 wherein said loop comprises a U-shaped portion.

4. The coil bobbin of claim 2 wherein said loop comprises an O-shaped portion.

* * * * *